United States Patent
Clifford et al.

(10) Patent No.: US 9,035,786 B2
(45) Date of Patent: May 19, 2015

(54) LED STROBE LIGHT WITH PERIPHERAL PATTERN DISPLAY

(71) Applicant: Checkers Industrial Products, LLC, Broomfield, CO (US)

(72) Inventors: Scott Clifford, Mesa, AZ (US); Steven N. D. Brundula, Chandler, AZ (US)

(73) Assignee: CHECKERS INDUSTRIAL PRODUCTS, LLC, Broomfield, CO (US)

( * ) Notice: Subject to any disclaimer, the term of this patent is extended or adjusted under 35 U.S.C. 154(b) by 214 days.

(21) Appl. No.: 13/796,867

(22) Filed: Mar. 12, 2013

(65) Prior Publication Data

US 2014/0085072 A1    Mar. 27, 2014

Related U.S. Application Data

(60) Provisional application No. 61/704,637, filed on Sep. 24, 2012.

(51) Int. Cl.
| | |
|---|---|
| G08B 21/00 | (2006.01) |
| H05B 33/08 | (2006.01) |
| B60Q 1/46 | (2006.01) |
| H05K 3/30 | (2006.01) |
| B60Q 1/26 | (2006.01) |
| H05K 1/14 | (2006.01) |
| H05K 3/36 | (2006.01) |

(52) U.S. Cl.
CPC ........ H05B 33/0845 (2013.01); H05B 33/0854 (2013.01); B60Q 1/46 (2013.01); H05K 3/30 (2013.01); Y10T 29/49128 (2015.01); B60Q 1/2611 (2013.01); B60Q 1/2696 (2013.01); H05K 1/141 (2013.01); H05K 3/366 (2013.01); H05K 2201/047 (2013.01); H05K 2201/10106 (2013.01); H05B 33/0803 (2013.01); Y10S 362/80 (2013.01)

(58) Field of Classification Search
CPC .................................. B60Q 1/46; H05B 37/00
USPC .................... 340/815.45, 981, 468, 471, 473; 362/470, 487, 800
See application file for complete search history.

(56) References Cited

U.S. PATENT DOCUMENTS

| | | | |
|---|---|---|---|
| 4,489,306 A * | 12/1984 | Scolari ........................ 340/473 |
| 2005/0110649 A1* | 5/2005 | Fredericks et al. ...... 340/815.45 |
| 2012/0319860 A1* | 12/2012 | Savage, Jr. ................ 340/691.8 |
| 2013/0264970 A1* | 10/2013 | Kuan et al. .................... 315/312 |

* cited by examiner

*Primary Examiner* — Jeffery Hofsass
(74) *Attorney, Agent, or Firm* — Holland & Hart

(57) ABSTRACT

A strobe light includes a base, a mounting post, a plurality of light emitting diode (LED) lights, a control system, and a lens. The mounting post extends vertically from the base. The plurality of LED lights are mounted around a periphery of the mounting post. The control system is coupled to the plurality of LED lights and operable to independently control each LED light to produce at least one of a 360° strobe light pattern and a rotating beacon light pattern. The lens is connected to the base and covers the plurality of LED lights.

26 Claims, 12 Drawing Sheets

LED STROBE LIGHT WITH PERIPHERAL PATTERN DISPLAY

RELATED APPLICATION

This claims the benefit of U.S. Provisional Application No. 61/704,637, filed 24 Sep. 2012, which is hereby incorporated by reference herein in its entirety.

BACKGROUND

Strobe lights are well-known products. A number of technologies are possible for use in strobe lights. Gas discharge strobe lights find particular application for emergency vehicles, radio towers, photography, and entertainment venues. Such conventional strobe lights utilize incandescent or gas light sources. Incandescent and gas source strobe lights have relatively high energy consumption and short lifetimes, which results in higher maintenance costs. Gas discharge strobe lights may be more susceptible to breaking, may produce ozone due to high voltage requirements, and produce ultraviolet light that breaks down many materials. Further, such strobe lights have complicated electronics used to maintain the flashing operation.

Another type of strobe light uses high intensity discharge (HID) lamps. Light is produced by high intensity discharge lamps when an electric current arced between two closely spaced electrodes in a sealed quartz-glass or ceramic capsule, known as a discharge tube, arc tube or burner, containing a vapor of metal and gas. Free electrons in the arc collide with the metal atoms in the vapor exciting electrons of the metal atoms to a higher energy state. When the excited electrons return to their original, lower energy level, electromagnetic radiation is emitted having a wavelength determined by the energy level of the electrons and the constituency of the vapor into the capsule. Compared to filament-type halogen lamps, HID lighting typically produces light more efficiently and with a color temperature more closely approximating that of sunlight. Unlike an incandescent lamp, an HID lamp does not immediately illuminate when the power is supplied to the lamp. While initiating operation of an HID lamp takes considerable time, the time required to re-strike (restart) an extinguished lamp is typically longer, and commonly twice as long as the cold startup interval. For these and other reasons, strobe lights that use HID lamps are less desirable in many applications.

Opportunities exist for improving strobe light technologies.

SUMMARY

As will be described in greater detail below, one aspect of the present disclosure relates to a strobe light including a base, a mounting post, a plurality of light emitting diode (LED) lights, a control system, and a lens. The mounting post extends vertically from the base. The plurality of LED lights are mounted around a periphery of the mounting post. The control system is coupled to the plurality of LED lights and operable to independently control each LED light to produce at least one of a 360° strobe light pattern and a rotating beacon light pattern. The lens is connected to the base and covers the plurality of LED lights.

The plurality of LED lights includes 6 LED lights. The mounting post includes a plurality of LED locations around a periphery of the mounting post, wherein each LED location is configured to support at least one of the plurality of LED lights. Each LED light may include an LED and an optic covering the LED, wherein the optic is configured to limit an output angle in at least one of a vertical direction and a horizontal direction. The optic may encapsulate the LED. The optic may limit the output angle of the vertical direction to less than about 90°. The strobe light may include a main circuit board interposed between the mounting post and the base, and the control system is mounted to the main circuit board.

The strobe light may include an ambient light sensor, and the control system may be configured to control intensity of light output from the plurality of LED lights based on output from the ambient light sensor. The strobe light may include a wireless remote configured to control operation of the strobe light remotely. The strobe light may include at least one switch accessible on an exterior of the base and operable to select between a plurality of settings for the strobe light. The strobe light may include a plurality of secondary circuit boards, a separate LED light is positioned on each secondary printed circuit board, and the plurality of secondary circuit boards are electrically coupled to the main circuit board.

Another aspect of the present disclosure relates to a strobe light that includes a base, a mounting post, a plurality of LED lights, a main circuit board, a control system and a lens. The mounting post includes a plurality of light locations around a periphery thereof, wherein each light location is defined by one of a plurality of secondary circuit boards. The secondary circuit boards may extend along a length of the mounting post from the main circuit board to the LED lights. The plurality of LED lights are mounted at the plurality of light locations. The main circuit board is electrically coupled to the plurality of secondary circuit boards. The control system is mounted to the main circuit board and configured to individually control each LED light to produce a plurality of light patterns. The lens is releasably mounted to the base and covers at least the plurality of LED lights.

The plurality of LED lights may include at least 6 LED lights and the mounting post may include up to 6 light locations, wherein at least one LED light is positioned at each of the plurality of light locations. A plurality of LED lights may be mounted at at least some of the plurality of light locations. One of the plurality of light patterns may include a 360° strobe, and another of the plurality of light patterns may include a 360° rotating beacon. The control system may be configured for wireless control from a remote location. Each LED light may include an LED and an optic covering the LED, wherein the optic restrict light output in at least a vertical direction. The strobe light may include a transceiver, and the strobe light may be configured for mounting to a vehicle. The transceiver may be configured to transmit a signal having indentifying information about the vehicle.

A further aspect of the present disclosure relates to a method of assembling a strobe light. The method includes providing a base, a lens, a control system, a main circuit board, a mounting post, and a plurality of LED lights, wherein the control system provides individual control of each LED light. The method also includes coupling the control system to the main circuit board, positioning the main circuit board on a top surface of the base, and mounting the mounting post on the main circuit board, the mounting post protruding away from the base. The method further includes positioning the plurality of LED lights on the mounting post at spaced apart locations around a periphery of the mounting post, electrically coupling the LED lights to control system via the main circuit board, and enclosing the LED lights within the lens and connecting the lens to the base.

The mounting post may include a plurality of secondary printed circuit boards defining the periphery of the mounting post, wherein the plurality of secondary printed circuit boards are electrically coupled to the main circuit board, and positioning the plurality of LED lights may include mounting the LED lights to the plurality of secondary printed circuit boards. The mounting post may include a hexagonal shaped outer surface defining 6 light locations around a periphery of the thereof, and positioning the LED lights on the mounting post may include positioning at least one LED light at each light location.

Another example method in accordance with the present disclosure relates to a method of operating a strobe light. The method includes providing the strobe light with a base, a lens, a control system, a mounting post, and a plurality of LED lights positioned on the mounting post at spaced apart locations around a periphery of the mounting post. The lens encloses the control system, mounting post, and LED lights. The method also includes operating the control system to individually control each LED light to provide a plurality of light patterns, wherein the plurality of light patterns includes at least a 360° strobe pattern and a 360° rotating beacon pattern.

The method may include providing an ambient light sensor, and controlling light intensity of the LED lights with the control system in response to output from the ambient light sensor. The method may include operating the control system remotely with a remote control device. The strobe light may include at least one switch accessible on an exterior of the base, and the method comprises operating the at least one switch to select between a plurality of settings for the strobe light. The strobe light may include a transceiver, the strobe light may be mounted to a vehicle, and the transceiver may be configured to transmit a signal having identification information about the vehicle.

Features from any of the above-mentioned embodiments may be used in combination with one another in accordance with the general principles described herein. These and other embodiments, features and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
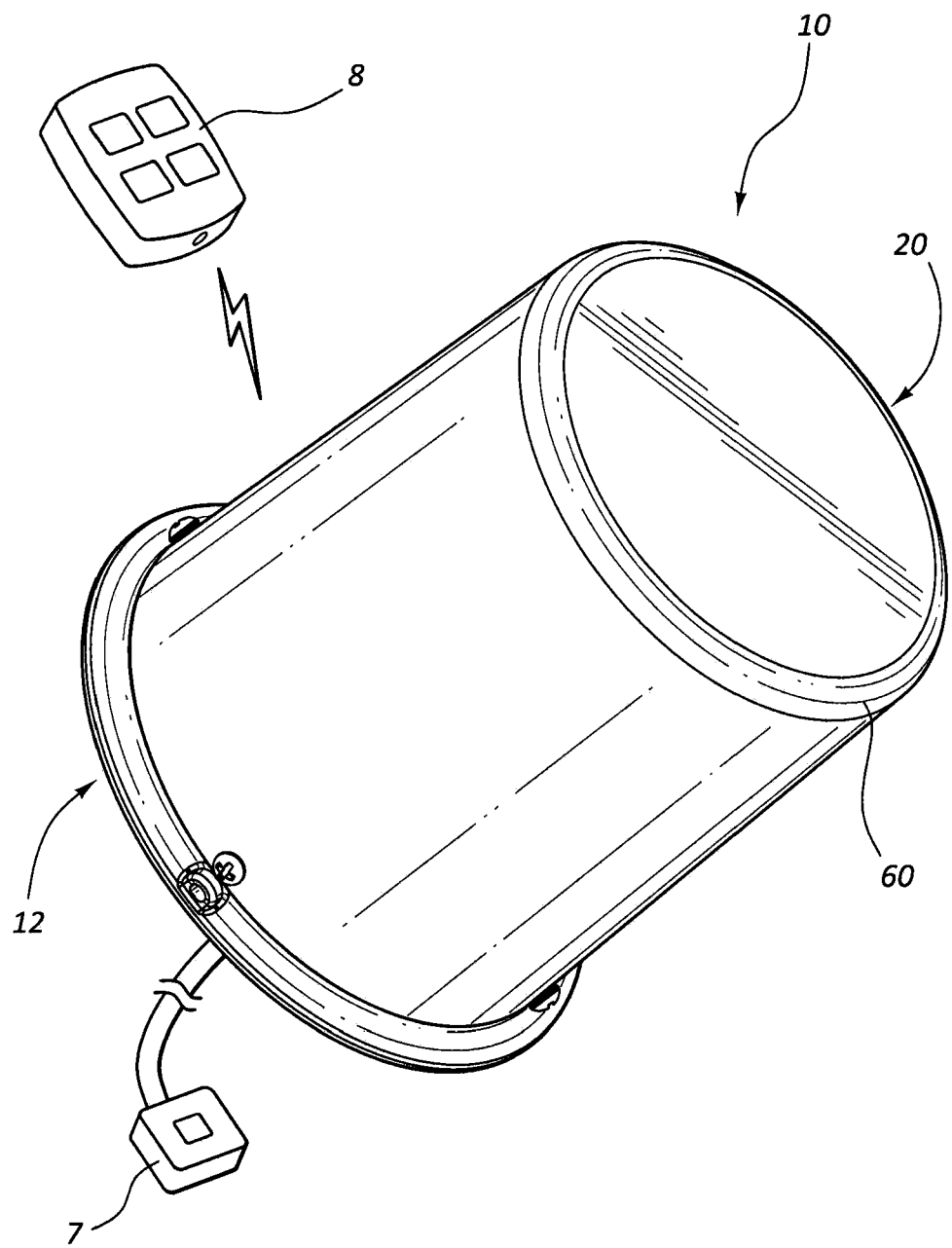
FIG. 1 is a perspective view of an example LED strobe light in accordance with the present disclosure.
Figure 6:
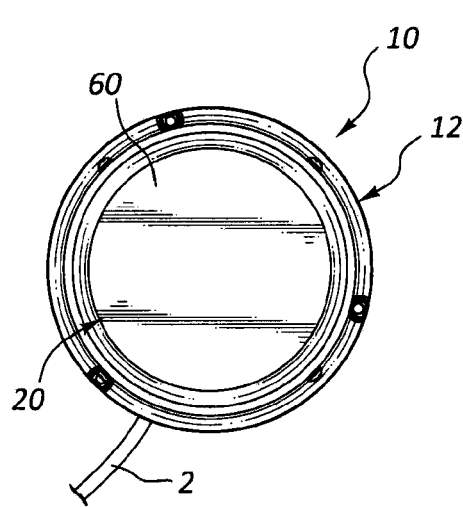
FIG. 6 is a top view of the LED strobe light of FIG. 1.
Figure 4:
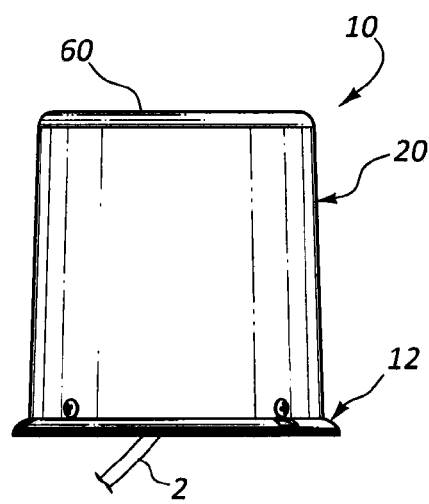
FIG. 4 is a right side view of the LED strobe light of FIG. 1.
Figure 2:
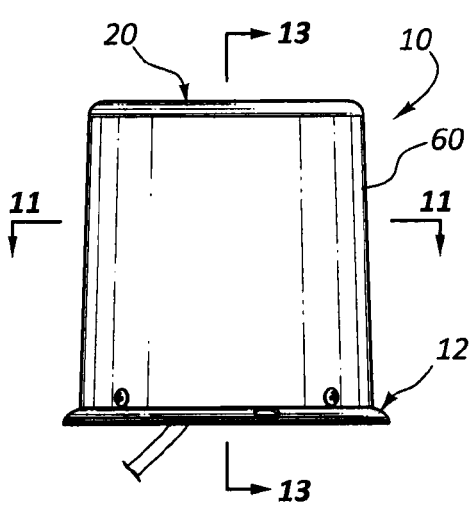
FIG. 2 is a front view of the LED strobe light of FIG. 1.
Figure 3:
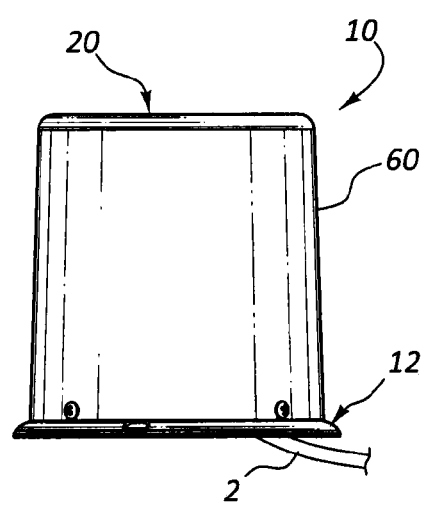
FIG. 3 is a rear view of the LED strobe light of FIG. 1.
Figure 7:
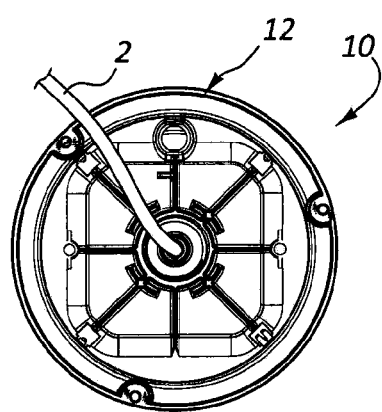
FIG. 7 is a bottom view of the LED strobe light of FIG. 1.
Figure 5:
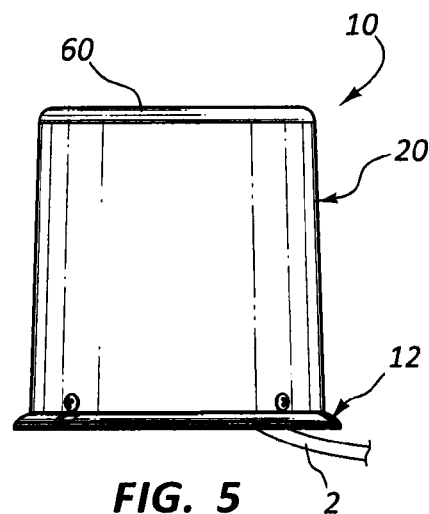
FIG. 5 is a left side view of the LED strobe light of FIG. 1.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, one of skill in the art will understand that the exemplary embodiments described herein are not intended to be limited to the particular forms disclosed. Rather, the instant disclosure covers all modifications, equivalents, and alternatives falling within the scope defined by the appended claims.

DETAILED DESCRIPTION OF EXEMPLARY EMBODIMENTS

As will be described in greater detail below, the present disclosure relates generally to strobe lights, and more particularly relates to strobe lights that include light-emitting diodes (LEDs) as the source of light. The LED strobe light may be programmed to create different light patterns. Some example light patterns include a 360° rotating light, a 360° strobe light, a solid light, and various flashing sequences.

The strobe light may include a plurality of LEDs. The LEDs may be arranged circumferentially and face radially outward. Each LED may be individually controlled with the control system of the strobe light. Controlling the LEDs may include turning on and off the LEDs and varying an intensity of light emitted from the LEDs.

The strobe light may be controlled via a hard-wire switch. The switch may operate the strobe light between a plurality of light patterns and settings. The switch may also operate other features such as, for example, an ambient light sensor and associated ambient light control, and a transceiver used for sending and receiving information to other objects. Alternatively, the strobe light may be controlled remotely using a wireless remote control device. In one example, the remote control device is a radio frequency (RF) device that is used to operate the strobe light from a remote location. The remote control device may operate the strobe light, for example, between on and off states, select among a plurality of different light patterns, operate an ambient light sensor and associated ambient light function, and control a transceiver, which transmits to and receives information from other objects. The strobe light may be mounted to a vehicle and the information transmitted from or received by the transceiver may include identification information about the vehicle or other vehicles.

Referring to FIGS. 1-14, an example LED strobe light 10 is shown and described. FIGS. 1-7 show the LED strobe light 10 fully assembled. The LED strobe light 10 is shown in at least FIGS. 8 and 9 partially disassembled and having a base 12, a mounting post 14, a plurality of LED lights 16, a main printed circuit board (PCB) 18, and a lens assembly 20. The mounting post 14 is connected to the main PCB 18, and the main PCB 18 is mounted to the base 12. The plurality of LED lights 16 are positioned on the mounting post 14. The lens assembly 20 is configured to be mounted to the base 12 and encloses the LED lights 16 and main PCB 18 as shown in at least FIGS. 1-7.

Figure 8:
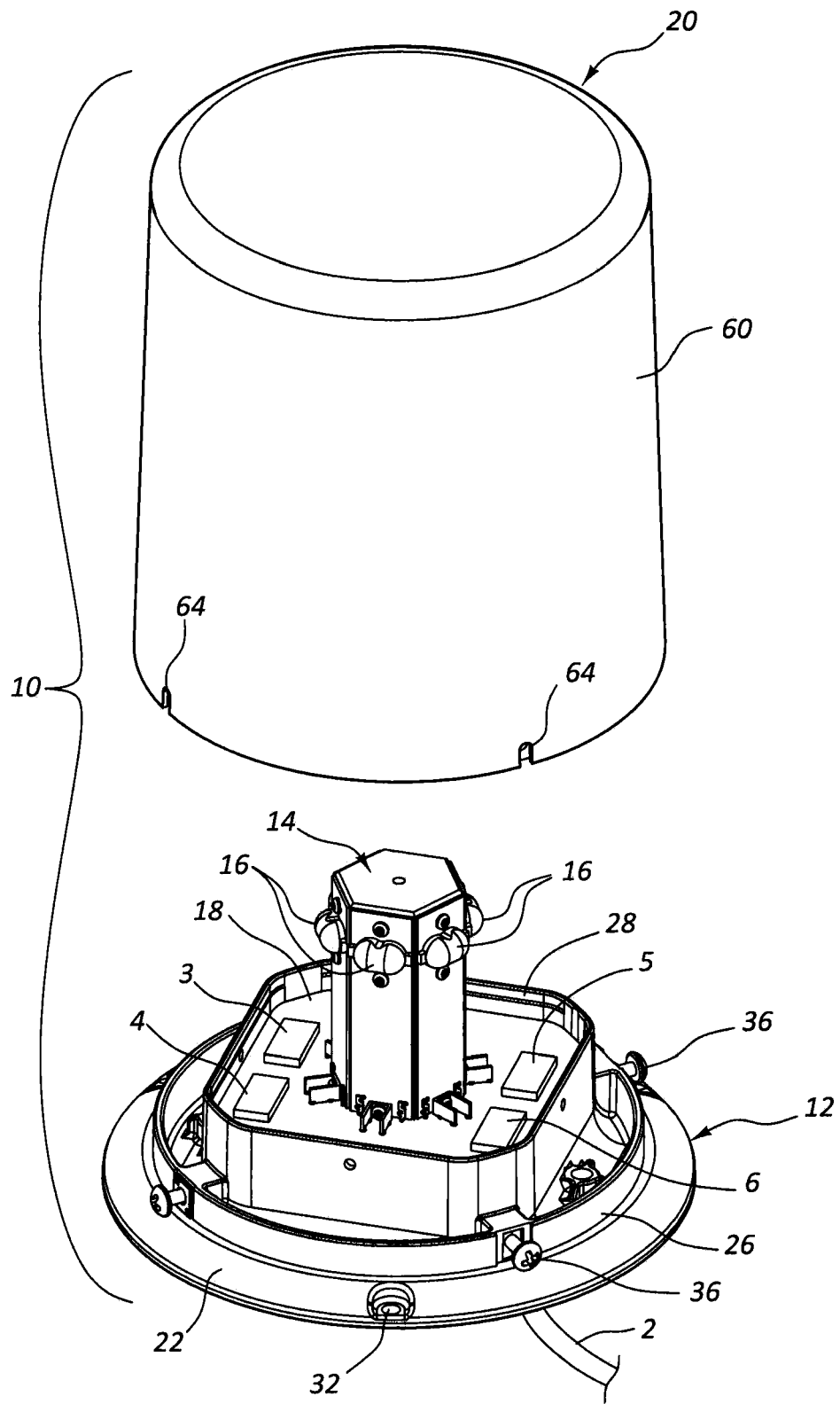
FIG. 8 is a top partially exploded perspective view of the LED strobe light of FIG. 1.
Figure 9:
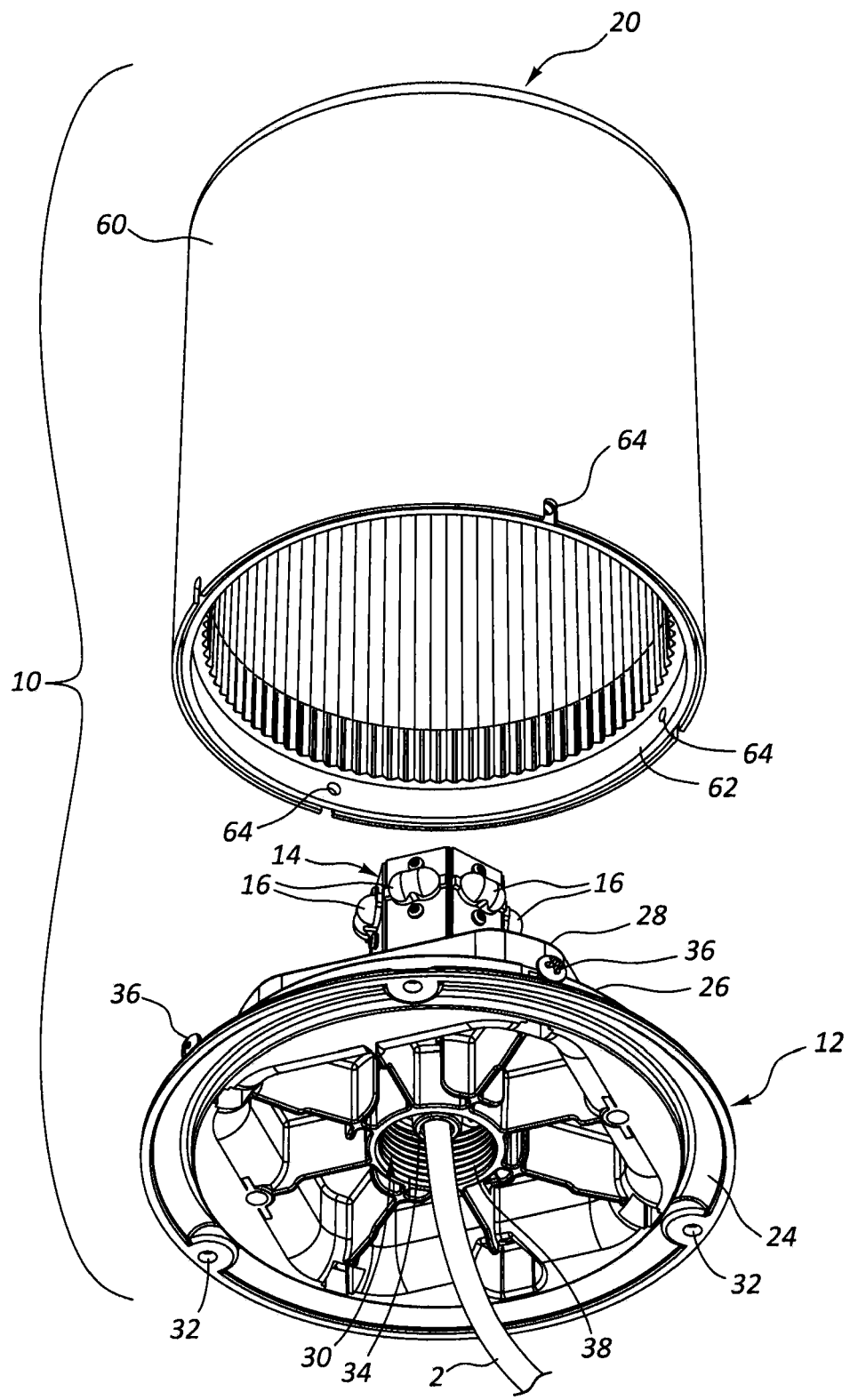
FIG. 9 is a bottom partially exploded perspective view of the LED strobe light of FIG. 1.

FIGS. 8-9 show the LED strobe light 10 also including a power cable 2, a controller 3, an ambient light sensor 4, a transceiver 5, a receiver 6, and a remote switch 7 (see FIG. 1). The power cable 2 may provide a source of power to the LED strobe light 10. The power cable 2 may also include a separate wire that extends from the main PCB 18 to the remote switch 7 to provide hard-wire control of the LED strobe light 10.

Figure 17:
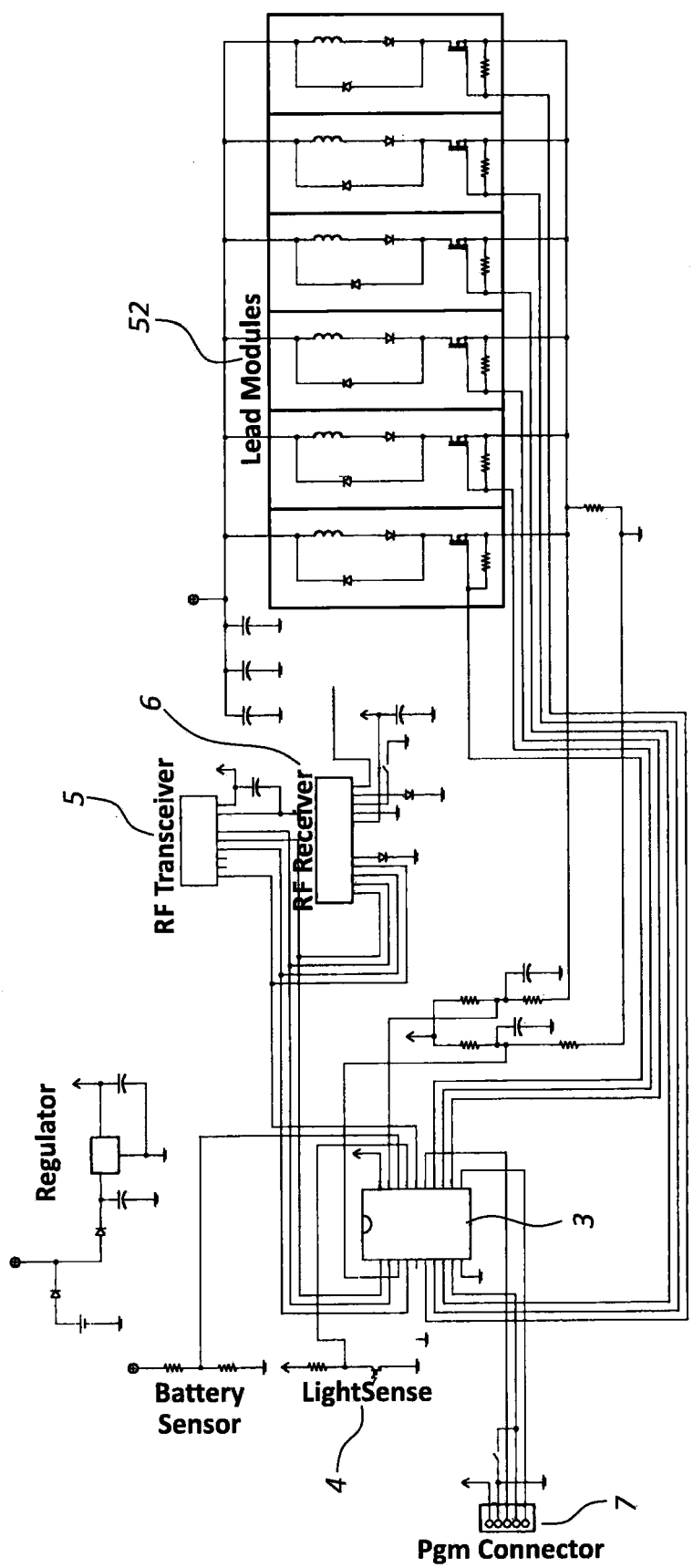
FIG. 17 is a circuit diagram of the LED strobe light of FIG. 1.

The controller 3 may be coupled to the LED lights 16, the ambient light sensor 4, the transceiver 5, and the receiver 6, and may be programmable to provide controls for various features of the LED strobe light 10. FIG. 17 shows a circuit diagram for the LED strobe light 10, which includes the controller 3, the ambient light sensor 4, the transceiver 5, the receiver 6, the remote switch 7, and the plurality of LEDs 52. In addition to receiving feedback from the various components of the circuitry shown in FIG. 17, the controller 3 may control any of the components in the circuit.

The controller 3 may be operated via the remote switch 7 or a wireless controller 8 (see FIG. 1). The wireless controller 8 may comprise a transceiver operable using, for example, radio frequency (RF) signals. The wireless controller 8 may operate the controller 3 and other features of LED strobe light 10 from a remote location. A remote location may be at a distance of, for example, about 0 to about 500 feet, and more preferably in the range of up to about 200 feet. The wireless controller 8 may comprise a waterproof housing. The wireless remote 8 may include a plurality of actuator features operable to control a plurality of different LED strobe lights, which may be positioned at different locations.

The ambient light sensor 4 may sense an ambient light condition and provide a signal to the controller 3 related to the ambient light condition. The controller 3 may operate to automatically reduce the light intensity emitted by LED light 16 in response to the signal from ambient light sensor 4 when ambient light drops below a threshold light condition. The ambient light sensor 4 may send a separate signal to controller 3 when the ambient light condition increases above a threshold light condition such that the controller automatically increases the light intensity of the LED light 16. In one example, the ambient light sensor 4 and controller 3 provide automatic dimming of the LED strobe light 10 during a night light condition, and provide automatic increase of light intensity during a day light condition.

The transceiver 5 may communicate information about the LED strobe light 10 or the object to which the LED strobe light 10 is mounted. For example, the LED strobe light 10 may be mounted to a vehicle and the transceiver transmits identification information about the vehicle to a remote object. The transceiver may be part of a proximity warning system, such as the system described in U.S. Provision Patent Application No. 61/704,263, titled "Vehicle Proximity Warning System and Methods," and filed on 21 Sep. 2012, the disclosure of which is incorporated herein in its entirety by this reference.

The receiver 6 may be configured to receive signals from the wireless controller 8. In at least some examples, the receiver 6 is configured as a transceiver that provides transmission and receipt of signals such that the LED strobe light 10 is capable of communicating information back to the wireless controller 8.

Referring to FIGS. 8 and 9, the base 12 includes top and bottom sides 22, 24, a lens seat 26, a circuitry seat 28, a center mounting aperture 30, a plurality of periphery mounting apertures 32, and a wiring aperture 34. The lens seat 26 may include a plurality of lens fasteners 36 used to secure the lens assembly 20 the base 12. The center mounting aperture 30 is accessible along the bottom side 24 and may include a plurality of threads 38. The center mounting aperture 30 may be configured for mounting to a standard, 1 inch threaded pipe or other mounting structure that provides threaded engagement. In other arrangements, the base 12 may include a plurality of magnets that provide a magnet mount of the LED strobe light 10 to a metal mounting structure. Alternatively, a plurality of fasteners may extend through the periphery mounting apertures 32 to secure the LED strobe light 10 to a mounting structure using the fasteners.

The wiring aperture 34 may extend through the bottom side 24 to provide a path for wire 2 to extend to the main PCB 18. In some examples, the base 12 includes a cutout around a peripheral edge thereof to permit the wire 2 to extend laterally to an exterior of the base 12 when the base 12 is resting on a support structure.

The circuitry seat 28 may include a recess sized to receive the main PCB 18. The circuitry seat 28 may include a raised platform that elevates the main PCB 18 above the lens seat 26. The circuitry seat 28 may include a raised lip or edge that retains the main PCB 18.

Figure 10:
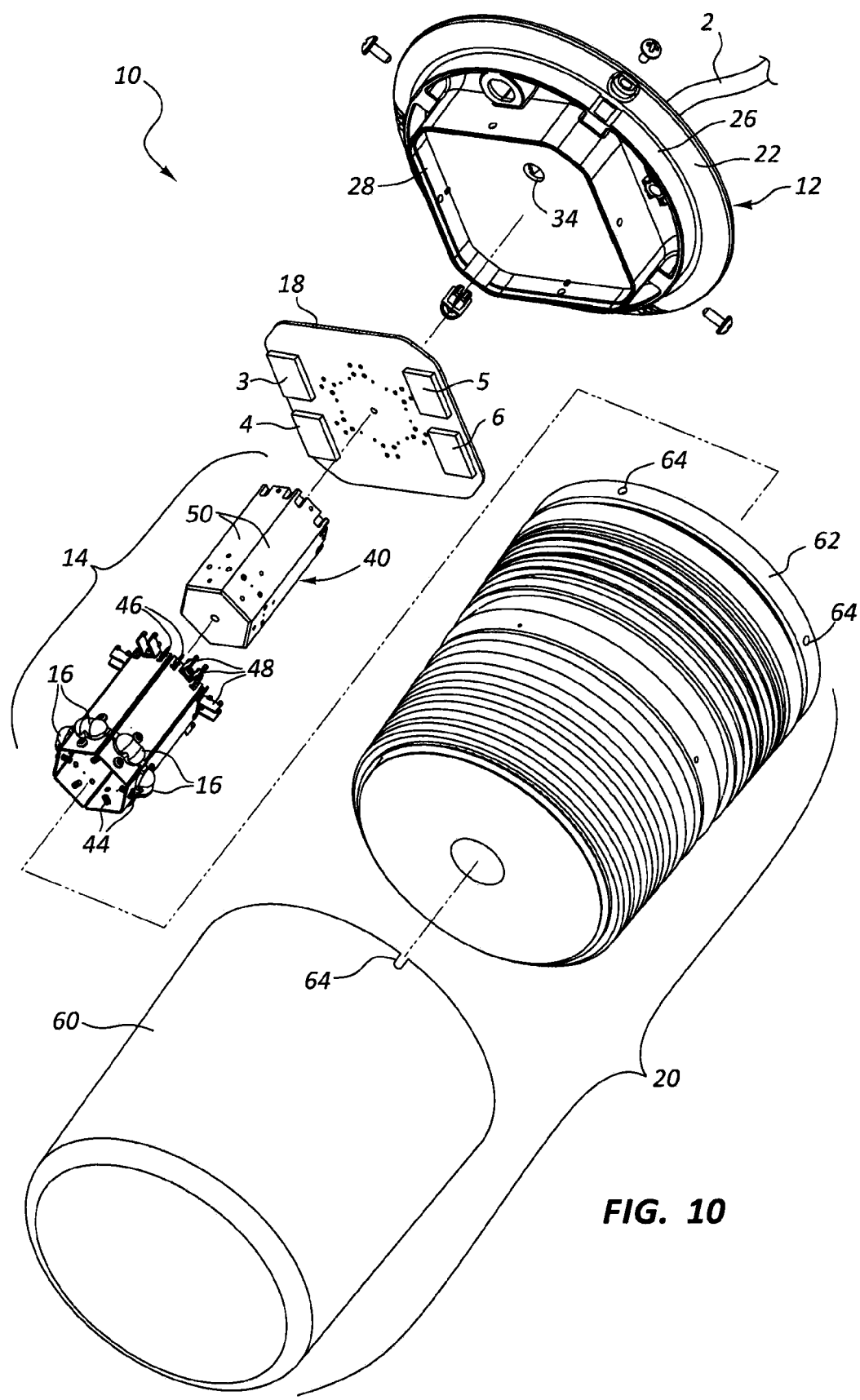
FIG. 10 is a top exploded perspective view of the LED strobe light of FIG. 1.

Referring to FIGS. 8-10, the mounting post 14 includes a central portion 40, a plurality of secondary PCBs 42, a plurality of post fasteners 44, a plurality of connector probes 46, and a plurality of base fasteners 48. The central portion 40 includes a plurality of mounting surfaces or mounting locations 50. The central portion 40 may have a hexagonal cross-sectional shape with six sides around its outer periphery. Each of the six sides may define a mounting surface 50. One of the secondary PCBs 42 may be mounted to each of the mounting surfaces 50. The secondary PCBs 42 are secured to the central portion 40 with the post fasteners 44. The connector probes 46 electrically connect to the secondary PCBs 42 to the main PCB 18. The base fasteners 48 secure the secondary PCBs 42 and central portion 40 to the main PCB 18. Alternative fastening features may be used to secure the main PCB 18 to the base 12 and connect the mounting post 14 to the base 12.

The central portion 40 may have other configurations with different numbers of mounting surfaces 50. For example, the central portion 40 may have two or more mounting surfaces. The mounting surfaces may be arranged in any desired orientation relative to each other including, for example, perpendicular to each other, at about 180° from each other, or at any angle between 0° and 180°. A separate secondary PCB may be mounted to each of the mounting surfaces. Other mounting configurations are possible in which the LED lights are mounted directly to the central portion and wiring is provided from the LEDs to the main PCB using a different structure than a secondary PCB.

The central portion 40 is shown having substantially vertical sidewalls that define the mounting surfaces 50. Other arrangements are possible in which the mounting surfaces 50 extend at an angle relative to a vertical plane. For example, the central portion 40 may have a generally conical structure such as a truncated conical structure having a plurality of radially inward tapered side surfaces that define the mounting surfaces 50.

A separate LED light 16 may be mounted to each of the mounting surfaces 50. The LED lights 16 may be mounted directly to the secondary PCBs 42, which are mounted to the mounting surfaces 50. At least one LED light may be positioned on each of the mounting surfaces 50. In some arrangements, two or more LED lights are positioned on at least some of the mounting surfaces 50. In other arrangements, some of the mounting surfaces 50 are empty with no LED lights positioned thereon.

Figure 15:
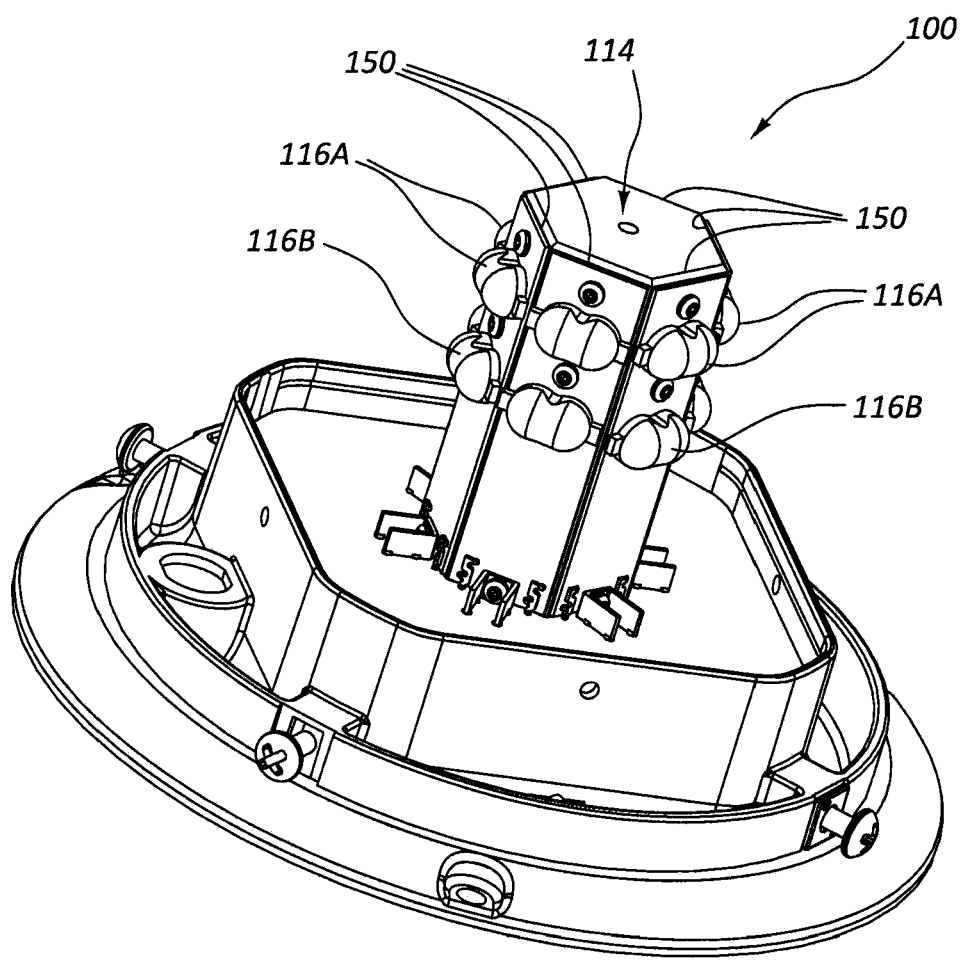
FIG. 15 is a perspective view of a portion of another example LED strobe light in accordance with the present disclosure.

FIG. 15 shows another example LED strobe light 100, which includes a mounting post 114 having first and second sets of LED lights 116A, 116B mounted on the mounting surfaces 150. The LED strobe light 100 includes two separate LED lights on each mounting surface. The LED lights 116A, 116B are arranged in rows around a periphery of the mounting post 114. The LED lights 116A, 116B may be aligned vertically on the mounting surfaces 150.

Figure 16:
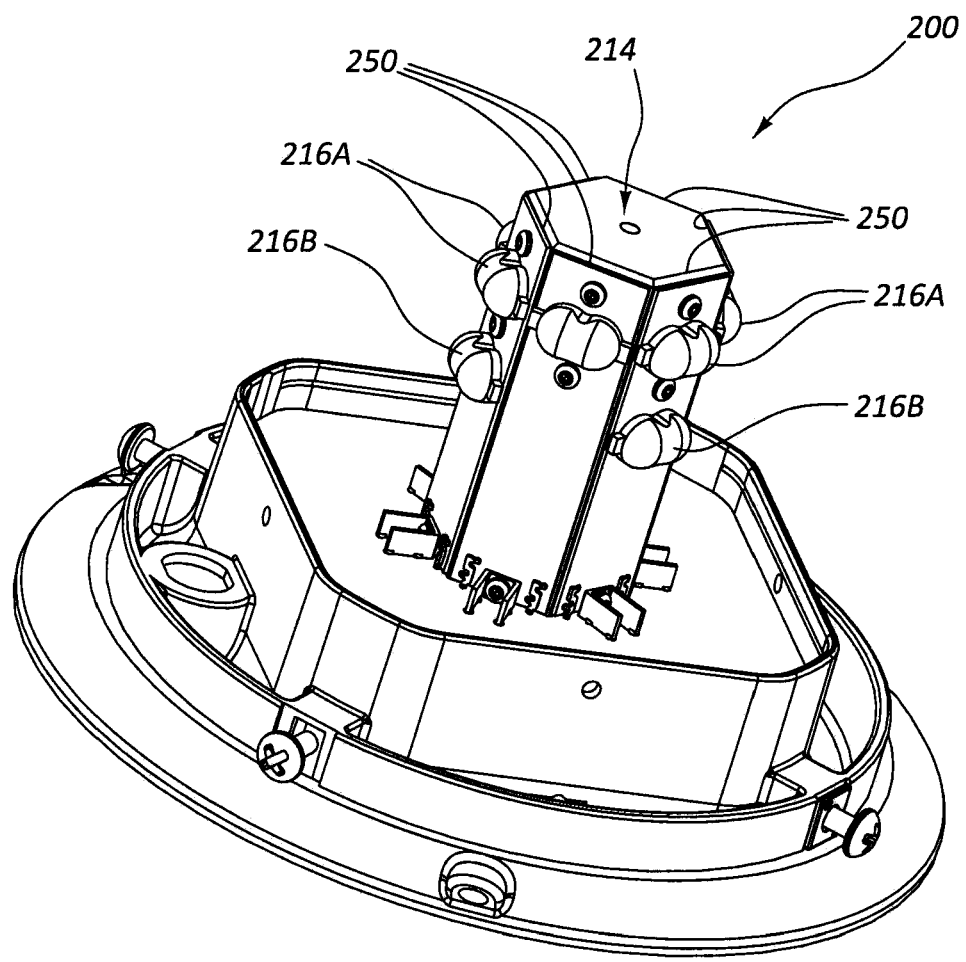
FIG. 16 is a perspective view of a portion of another example LED strobe light in accordance with the present disclosure.

FIG. 16 shows another example LED strobe light 200, which includes a mounting post 214 and first and second sets of LED lights 216A, 216B. The first set of LED lights 216A provide a separate LED light on each of a plurality of mounting surfaces 250. The second set of LED lights 216B provide an LED light on only some of the mounting surfaces 250 (e.g., on every other one of the mounting surfaces 250 around the periphery of mounting post 214). Other configurations are possible wherein no LED lights are positioned on at least one mounting surface of the mounting post.

Each LED light in the examples shown herein may be affixed to a secondary PCB as an assembly that is independently mounted to and removed from the central portion 40 of the mounting post 14. In the event of replacing the LED 16 for purposes of maintenance or exchanging the LED, the assembly of the LED with the secondary PCB may be removed by disconnecting the post fasteners 44 and the base fasteners 48 associated with that assembly.

Figure 13:
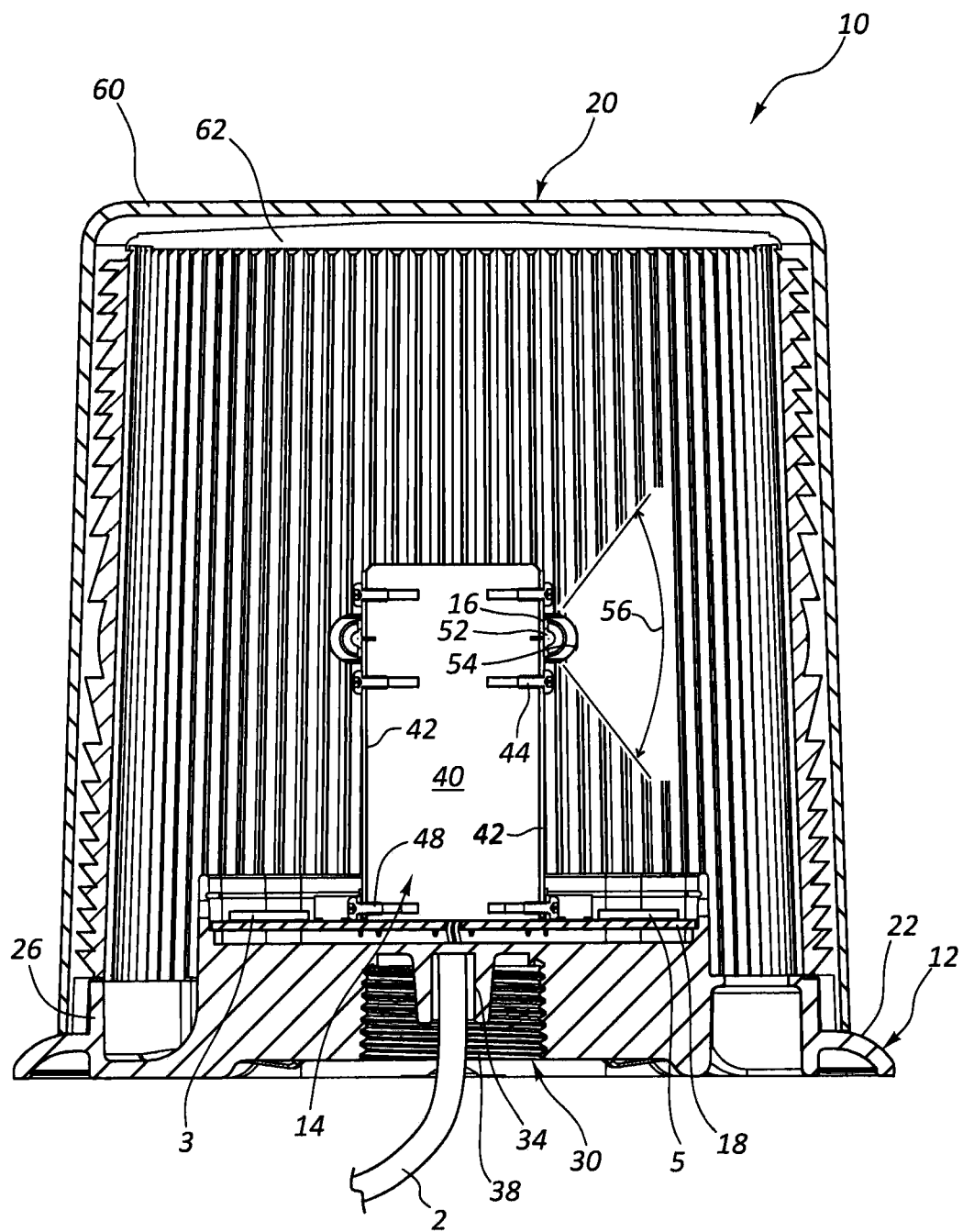
FIG. 13 is a cross-sectional view of the LED strobe light of FIG. 2 taken along cross section indicators 13-13.
Figure 14:
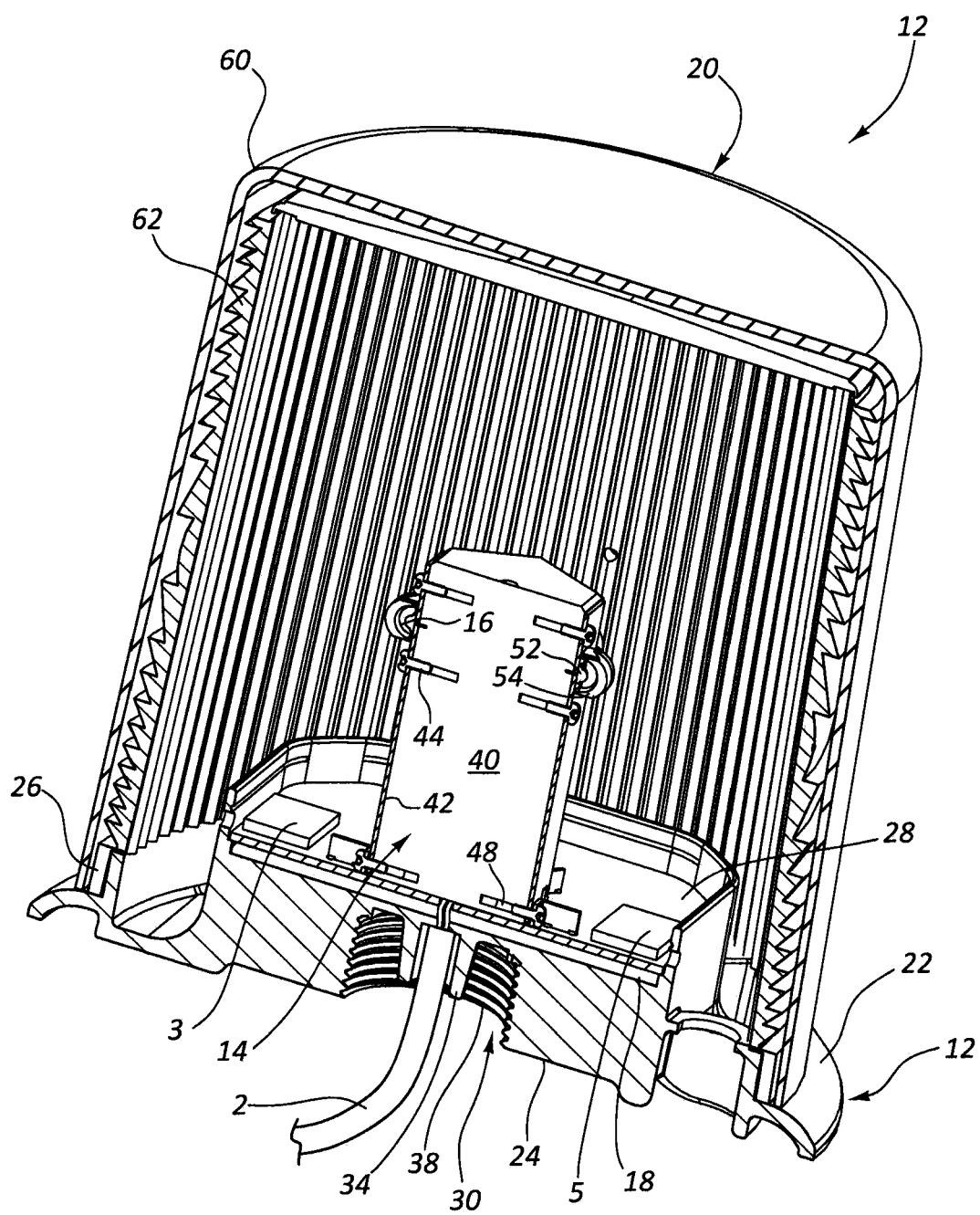
FIG. 14 is a perspective view of the cross-section shown in FIG. 13.

Each of the LED lights 16 includes an LED 52 and an optic 54 (see FIGS. 13 and 14). The optic 54 may provide a restricted angle of output for light emitted from LED 52. The optic 54 may cover the LED 52, and in some arrangements, may encapsulate the LED 52.

Figure 11:
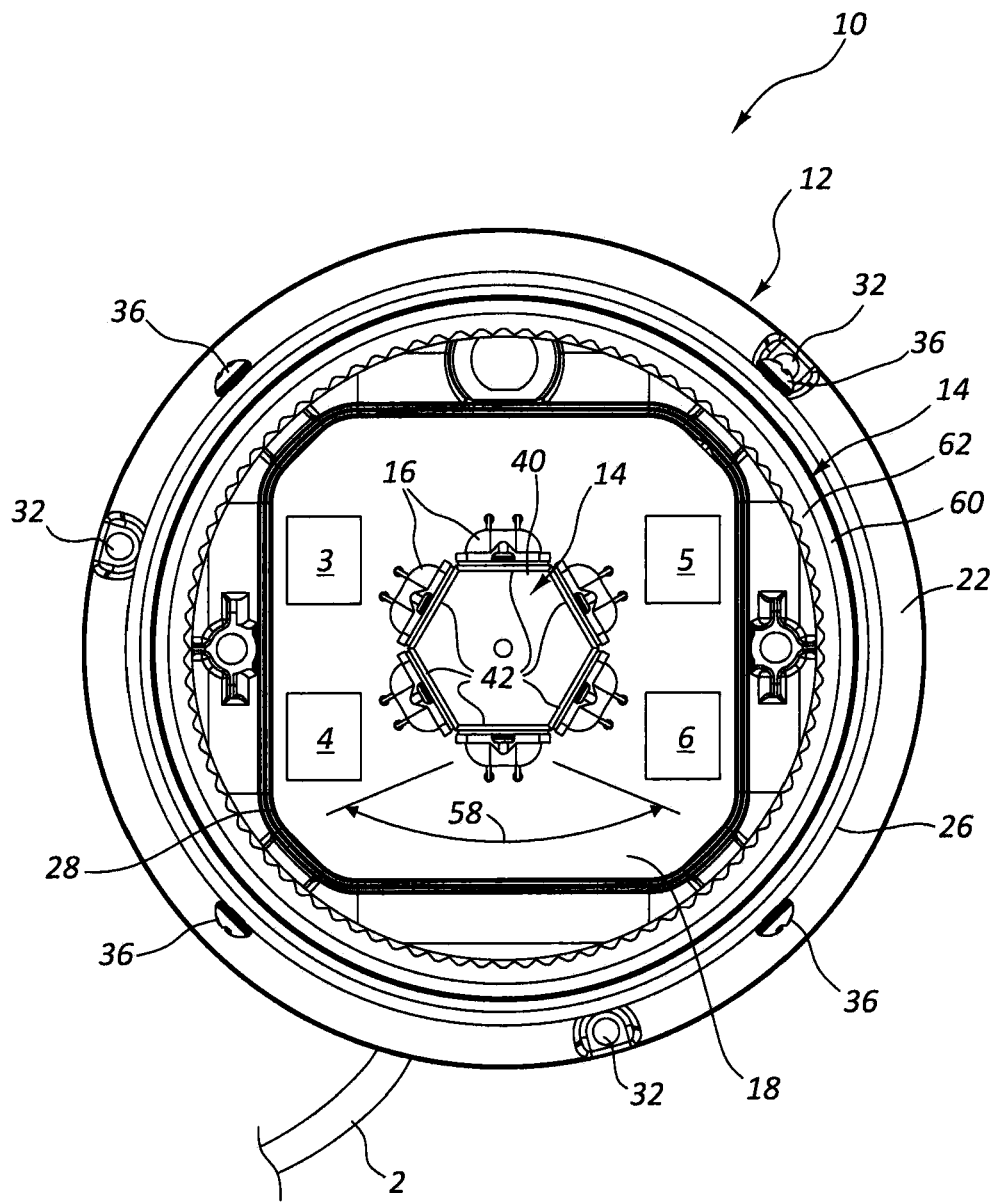
FIG. 11 is a cross-sectional view of the LED strobe light of FIG. 2 taken along cross-section indicators 11-11.
Figure 12:
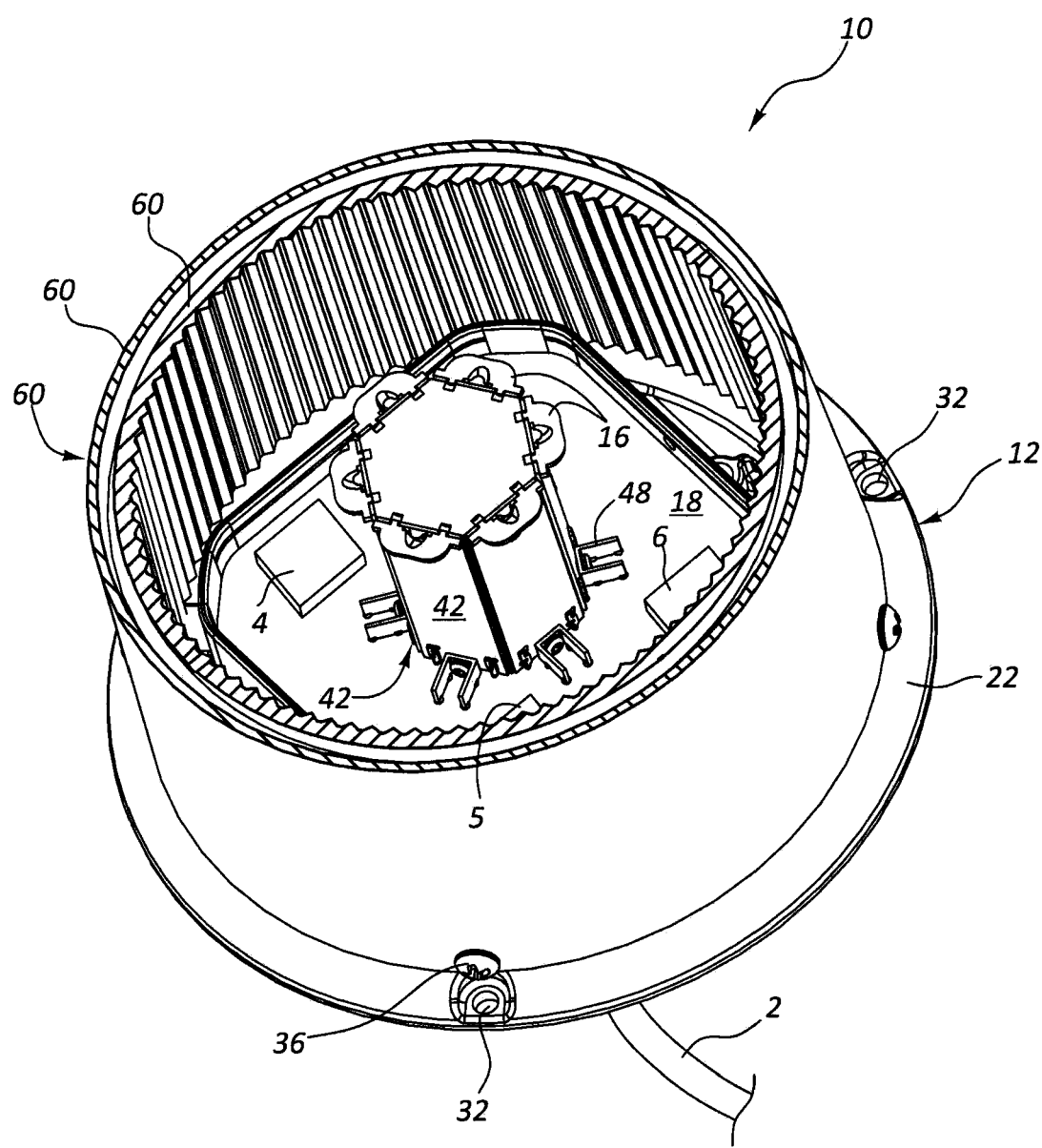
FIG. 12 is a perspective view of the cross-section shown in FIG. 11.

FIG. 13 shows the optic 54 providing a restricted light path in a vertical direction through a vertical angle 56. FIG. 11 shows the optic 54 having a restricted angle in a horizontal direction through a horizontal angle 58. Typically, the vertical angle 56 is in a range of about 20° to about 120°, and more preferably in the range of about 80° to about 90°. The horizontal angle 58 is typically in the range of about 90° to about 150°, and more preferably in the range of about 110° to about 130°. The optic 54 shown in the figures may provide a more focused emitting angle for the light in a horizontal direction for easier viewing by people or objects in an immediate area around the LED strobe light 10. Typically, the LED strobe light 10 is not viewed from above, so focusing the light path in a more horizontal direction with the optic 54 may be more effective use of the light output.

The controller 3 provides individual control of each LED light 16. The controller 3 controls an on/off state as well as a light intensity emitted from each LED light 16. The intensity of light emitted by an LED light is generally controlled by an amount of current supplied to the LED light. The controller 3 operates to control an amount of current supplied to each LED light 16 to control an on/off state and light intensity level for the LED light 16 to provide any desired light pattern or setting for the LED strobe light 10. One such light pattern is a 360° rotating beacon light pattern. Another example light pattern is a strobe light pattern, such as a 360° strobe. A still further light output is a constant on (constant burn) state, or a dimmed constant burn state (e.g., in response to a reduced ambient light signal received from ambient light sensor 4).

The lens assembly is shown in at least FIG. 10 having a dust cover 60 and a lens 62. The lens 62 may help direct light emitted from the LED light 16 in a generally horizontal direction rather than a vertical direction. The lens assembly 20 may include a plurality of fastener openings 64 that receive the lens fasteners 36 and base 12 to secure the lens assembly 20 to the base 12. The dust cover 60 and/or lens 62 may have any desired color to provide a desired colored light output from the LED strobe light 10. The LED lights 16 may also have different colors to adjust a color of light output from the LED strobe light 10.

An example method of assembling a strobe light in accordance with the present disclosure includes providing a base, a lens, a control system, a main circuit board, a mounting post, and a plurality of LED lights. The control system provides individual control of each LED light. The control system is coupled to the main circuit board. The main circuit board is mounted to the base. The mounted post is mounted to the main circuit board and arranged to protrude away from the base. The LED lights are positioned on the mounting post at spaced apart locations around the periphery of the mounting post. The LED lights are electrically connected to the control system via, for example, the main circuit board. The LED lights are enclosed within a lens and the lens is connected to the base.

The method may also include providing the mounting post with a plurality of secondary printed circuit boards, which are electrically connected to the main circuit board, and the LED lights are mounted to the secondary printed circuit boards. The mounting post may include a hexagonal shaped outer surface that defines light locations around a periphery of the mounting post, and the LED lights are positioned on the mounting post. Typically, at least one LED light may be positioned at each light location.

Another example method relates to operating the strobe light. The method includes providing the strobe light with a base, a lens, a control system, a mounting post, and a plurality of LED lights. The LED lights are positioned on the mounting post and the lens encloses the LED lights. The control system operates to individually control each LED light to provide a plurality of light patterns. The light patterns may include at least a 360° strobe light pattern and a 360° rotating beacon light pattern, as well as a constant on (constant burn) pattern.

The method may also include providing an ambient light sensor and controlling the intensity of the LED lights with a control system in response to output from the ambient light sensor. The method may include operating the control system remotely with a remote control device. Alternatively, the strobe light may be controlled using a switch accessible from outside of the base, wherein the switch is operable to select between a plurality of settings for the strobe light. The strobe light may include a transceiver and be mounted to a vehicle. The transceiver may be configured to transmit a signal having identification information about the vehicle.

In one example, an LED strobe light in accordance with the present disclosure includes between about 6 and 12 high intensity LEDs that produce between about 500 and about 2,000 lumens of LED power, and more preferably in the range of about 750 to about 1,600 lumens of LED power. Each LED light may include an optic attached to an LED, where in the optic is optimized for strobe light applications in which light is directed in a generally horizontal direction. The light produced by the LED strobe light may meet certain certification requirements such as, for example, SAE Class 1 J845 certification requirement.

With independent LED control via, for example, separate LED circuit drivers associated with each LED light, a microcontroller may make each LED intensity fully variable and programmable. With full intensity control of each LED location (e.g., each mounting surface 50 of the mounting post 14), it may be possible to create a complete reproduction of a rotating beacon light using a plurality of LEDs arranged circumferentially.

The example LED strobe light may have an operational voltage in the range of about 6 Volts to about 60 Volts, and more preferably in the range of about 12 Volts to about 48 Volts. The LED strobe light may have a total height in the range of about 2 inches to about 12 inches, and more preferably in the range of about 4 inches to about 6 inches. The LED strobe light may be Title 13 compliant. The LED strobe light may include potted electronics and include RFI filtering to meet FCC compliance standards. The LED strobe light may come in a variety of colors including, for example, amber, red, white, blue and green. The color may be provided by the lens or the LED lights. The LED strobe light may be mountable via, for example, a standard 1 inch pipe NPT, or may be mounted using a magnet mount.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the present systems and methods and their practical applications, to thereby enable others skilled in the art to best utilize the present systems and methods and various embodiments with various modifications as may be suited to the particular use contemplated.

Unless otherwise noted, the terms "a" or "an," as used in the specification and claims, are to be construed as meaning "at least one of." In addition, for ease of use, the words "including" and "having," as used in the specification and claims, are interchangeable with and have the same meaning as the word "comprising."

What is claimed is:

1. A strobe light, comprising:
a base;
a mounting post extending vertically from the base;
a plurality of light emitting diode (LED) lights mounted around a periphery of the mounting post;
a control system coupled to the plurality of LED lights and operable to independently control each LED light to produce at least one of a 360° strobe light pattern and a rotating beacon light pattern;
a lens connected to the base and covering the plurality of LED lights, the lens being configured to direct light emitted from the plurality of LED lights in a horizontal direction rather than a vertical direction.

2. The strobe light of claim 1, wherein the plurality of LED lights comprises 6 LED lights.

3. The strobe light of claim 1, wherein the mounting post including a plurality of LED locations around a periphery of the mounting post, each LED location being configured to support at least one of the plurality of LED lights.

4. The strobe light of claim 1, wherein each LED light includes an LED and an optic covering the LED, the optic configured to limit an output angle in at least one of a vertical direction and a horizontal direction.

5. The strobe light of claim 4, wherein the optic encapsulates the LED.

6. The strobe light of claim 4, wherein the optic limits the output angle of the vertical direction to less than about 90°.

7. The strobe light of claim 1, further comprising a main circuit board interposed between the mounting post and the base, the control system being mounted to the main circuit board.

8. The strobe light of claim 1, further comprising an ambient light sensor, the control system configured to control intensity of light output from the plurality of LED lights based on output from the ambient light sensor.

9. The strobe light of claim 1, further comprising a wireless remote configured to control operation of the strobe light remotely.

10. The strobe light of claim 1, further comprising at least one switch accessible on an exterior of the base and operable to select between a plurality of settings for the strobe light.

11. The strobe light of claim 7, further comprising a plurality of secondary printed circuit boards, a separate LED light being positioned on each secondary printed circuit board, and the plurality of secondary printed circuit boards being electrically coupled to the main circuit board.

12. A strobe light, comprising:
a base;
a mounting post having a plurality of light locations around a periphery thereof, each light location being defined by one of a plurality of secondary printed circuit boards;
a plurality of light emitting diode (LED) lights mounted at the plurality of light locations;
a main circuit board electrically coupled to the plurality of secondary printed circuit boards;
a control system mounted to the main circuit board and configured to individually control each LED light to produce a plurality of light patterns;
a lens releasably mounted to the base and covering at least the plurality of LED lights, the lens being configured to direct light emitted from the plurality of LED lights in a horizontal direction rather than a vertical direction.

13. The strobe light of claim 12, wherein the plurality of LED lights comprises at least 6 LED lights, and the mounting post includes up to 6 light locations, at least one LED light positioned at each of the plurality of light locations.

14. The strobe light of claim 12, wherein a plurality of LED lights are mounted at at least some of the plurality of light locations.

15. The strobe light of claim 12, wherein one of the plurality of light patterns includes a 360° strobe, and another of the plurality of light patterns includes a 360° rotating beacon.

16. The strobe light of claim 12, wherein the control system is configured for wireless control from a remote location.

17. The strobe light of claim 12, wherein each LED light includes an LED and an optic covering the LED, the optic restricting light output in at least a vertical direction.

18. The strobe light of claim 12, further comprising a transceiver, the strobe light configured for mounting to a vehicle, the transceiver configured to transmit a signal having identifying information about the vehicle.

19. A method of assembling a strobe light, comprising:
providing a base, a lens, a control system, a main circuit board, a mounting post, and a plurality of LED lights, the control system providing individual control of each LED light;
coupling the control system to the main circuit board;
positioning the main circuit board on a top surface of the base;
mounting the mounting post on the main circuit board, the mounting post protruding away from the base;
positioning the plurality of LED lights on the mounting post at spaced apart locations around a periphery of the mounting post;
electrically coupling the LED lights to control system via the main circuit board;
enclosing the LED lights within the lens and connecting the lens to the base, wherein the lens is positioned relative to the LED lights to direct light emitted from the LED lights in a horizontal direction rather than a vertical direction.

20. The method of claim 19, wherein the mounting post includes a plurality of secondary printed circuit boards defining the periphery of the mounting post, the plurality of secondary printed circuit boards being electrically coupled to the main circuit board, and positioning the plurality of LED lights includes mounting the LED lights to the plurality of secondary printed circuit boards.

21. The method of claim 19, wherein the mounting post includes a hexagonal shaped outer surface defining 6 light locations around a periphery of the thereof, and positioning the LED lights on the mounting post includes positioning at least one LED light at each light location.

22. A method of operating a strobe light, comprising:
providing the strobe light with a base, a lens, a control system, a mounting post, and a plurality of LED lights positioned on the mounting post at spaced apart locations around a periphery of the mounting post, the lens enclosing the control system, mounting post, and LED lights, wherein the lens is configured to direct light emitted from the plurality of LED lights in a horizontal direction rather than a vertical direction;
operating the control system to individually control each LED light to provide a plurality of light patterns, the plurality of light patterns including at least a 360° strobe pattern and a 360° rotating beacon pattern.

23. The method of claim 22, further comprising providing an ambient light sensor, and controlling light intensity of the LED lights with the control system in response to output from the ambient light sensor.

24. The method of claim 22, further comprising operating the control system remotely with a remote control device.

25. The method of claim 24, wherein the strobe light comprises at least one switch accessible on an exterior of the base, the method comprising operating the at least one switch to select between a plurality of settings for the strobe light.

26. The method of claim 22, wherein the strobe light comprises a transceiver, the strobe light being mounted to a vehicle, the transceiver configured to transmit a signal having identification information about the vehicle.

* * * * *